(12) United States Patent
Ross

(10) Patent No.: US 7,190,193 B1
(45) Date of Patent: Mar. 13, 2007

(54) METHOD AND APPARATUS FOR A DIFFERENTIAL DRIVER WITH VOLTAGE TRANSLATION

(75) Inventor: James P. Ross, Lakeville, MN (US)

(73) Assignee: Xilinx, Inc., San Jose, CA (US)

( * ) Notice: Subject to any disclaimer, the term of this patent is extended or adjusted under 35 U.S.C. 154(b) by 149 days.

(21) Appl. No.: 11/111,006

(22) Filed: Apr. 21, 2005

(51) Int. Cl.
*G01R 19/00* (2006.01)
*H03K 19/094* (2006.01)

(52) U.S. Cl. ............................ 327/52; 327/53; 327/65; 327/66; 326/115

(58) Field of Classification Search ................ 327/52, 327/53, 56, 65, 66; 326/115, 127
See application file for complete search history.

(56) References Cited

U.S. PATENT DOCUMENTS 5,451,898 A * 9/1995 Johnson ...................... 327/563
5,629,645 A * 5/1997 Okajima et al. ............. 327/399
5,889,415 A * 3/1999 Parkinson .................... 326/68
6,433,528 B1 * 8/2002 Bonelli et al. .............. 323/315
7,053,670 B2 * 5/2006 Muto et al. .................. 327/65

OTHER PUBLICATIONS

U.S. Appl. No. 11/067,422, filed Feb. 25, 2005, Zhou et al.

* cited by examiner

*Primary Examiner*—Vibol Tan
(74) *Attorney, Agent, or Firm*—Michael T. Wallace

(57) ABSTRACT

A differential amplifier is configured to receive an input signal whose magnitude is referenced between a reference voltage and a first power supply magnitude. A differential current conducted by the differential amplifier induces current to be conducted by a first current mirror, which in turn induces current to be conducted by a second current mirror. The current conducted by the second current mirror produces an output signal that is referenced between the reference voltage and a second power supply magnitude.

20 Claims, 5 Drawing Sheets

US 7,190,193 B1

METHOD AND APPARATUS FOR A DIFFERENTIAL DRIVER WITH VOLTAGE TRANSLATION

FIELD OF THE INVENTION

The present invention generally relates to drivers, and more particularly to differential drivers that provide voltage translation.

BACKGROUND

Recent advances in the field of semiconductor integrated circuits have brought about higher levels of integration. Semiconductor manufacturing process advancements are driving the corresponding geometric dimensions for semiconductor devices to decreasingly smaller values. As semiconductor device dimensions shrink, the number of devices per unit area of semiconductor die grows. Given higher device densities within semiconductor die, a greater opportunity exists that devices, which must interface to one another, operate at incompatible drive levels.

Incompatible drive levels may also pose integration problems when the interface circuitry of two devices do not share the same semiconductor die. A configuration device, for example, implemented to download configuration data to a programmable logic circuit, may be operating at a much higher potential than the programmable logic circuit. In such an instance, the voltage magnitude of the configuration data generated by the configuration device may be at levels that are more than twice the voltage magnitudes required by the programmable logic circuit. As such, an intermediate voltage translation device is necessary to translate the configuration data from its relatively high voltage levels, to the relatively low voltage levels that are compatible with the programmable logic circuit.

In the prior art, pass transistors are often employed to perform the voltage translation that is required between communication devices operating at different voltage levels. In particular, the symmetrical properties of Field Effect Transistors (FET) are often employed, such that logic values at a first voltage level are presented to a first conductor of the FET and then translated to logic values at a second voltage level at a second conductor of the FET. Such a translation circuit, however, also requires fairly sophisticated bias control circuitry, in order to maintain a proper bias voltage at the control terminal of the FET to allow the logic values to properly propagate through the FET.

A further disadvantage of the prior art translation circuits may result from their lack of current drive capability, as the level of current provided by the prior art pass transistor may be limited by its geometry. Furthermore, in order to implement differential translation capability, two pass transistors are required, each requiring separate bias control circuitry.

SUMMARY

To overcome limitations in the prior art, and to overcome other limitations that will become apparent upon reading and understanding the present specification, the present invention discloses an apparatus and method for providing differential voltage translation capability from logic values that are referenced to a first voltage level to logic values that are referenced to one or more alternate voltage levels.

In accordance with one embodiment of the invention, a translation circuit comprises an amplifier that is coupled to receive an input signal having a magnitude that is less than or equal to a first power supply magnitude. In response, the amplifier is adapted to provide a first current signal. The translation circuit further comprises a first current mirror that is coupled to receive the first current signal. In response, the first current mirror is adapted to conduct a second current signal in ratio proportion to the first current signal. The translation circuit further comprises a second current mirror that is coupled to receive the second current signal. In response, the second current mirror is adapted to conduct a third current signal in ratio proportion to the second current signal. The translation circuit further comprises a load that is coupled to receive the third current signal. In response, the load is adapted to generate an output signal having a magnitude that is less than or equal to a second power supply magnitude.

In accordance with another embodiment of the invention, an integrated circuit comprises a first circuit component that is adapted to generate a first data signal having a first magnitude and a translation circuit that is coupled to the first circuit component. The translation circuit includes an amplifier that is coupled to a first power supply. The first power supply has a magnitude that is greater than or equal to the first magnitude. The amplifier is further coupled to receive the first data signal and is adapted to generate a first current signal in response to the first data signal. The translation circuit further includes a current mirror network that is coupled to a second power supply. The second power supply has a magnitude that is greater than or equal to a second magnitude. The current mirror network is further coupled to receive the first current signal and is adapted to generate a second current signal in response to the first current signal. The second current signal is effective to generate a second data signal having the second magnitude.

In accordance with another embodiment of the invention, a method translates an input signal having a first magnitude to an output signal having a second magnitude. The method comprises conducting a first current from a first power supply in response to receiving the input signal at the first magnitude. The method further comprises conducting a second current in ratio proportion to the first current, where the second current is conducted from a second power supply. The method further comprises conducting a third current in ratio proportion to the second current, where the third current is conducted from the second power supply. The third current generates the output signal at the second magnitude.

BRIEF DESCRIPTION OF THE DRAWINGS

Various aspects and advantages of the invention will become apparent upon review of the following detailed description and upon reference to the drawings in which.

DETAILED DESCRIPTION

Generally, some embodiments of the present invention are applied to the field of voltage translation, whereby logic levels provided by a first communication device are incompatible with logic levels required by a second communication device. One embodiment of the present invention allows the two devices to communicate with one another despite their incompatibilities.

In particular, an embodiment of the present invention acts as a buffer between the incompatible communication devices, whereby relatively high voltage levels received by the buffer are converted to relatively low voltage levels (or vice versa). Data is received by a high voltage section of the buffer, which creates the flow of a current in the high voltage section. This current is mirrored by a low voltage section of the buffer and mirrored once again to produce an output signal that is referenced to the operational voltage of the low voltage section.

Figure 1:
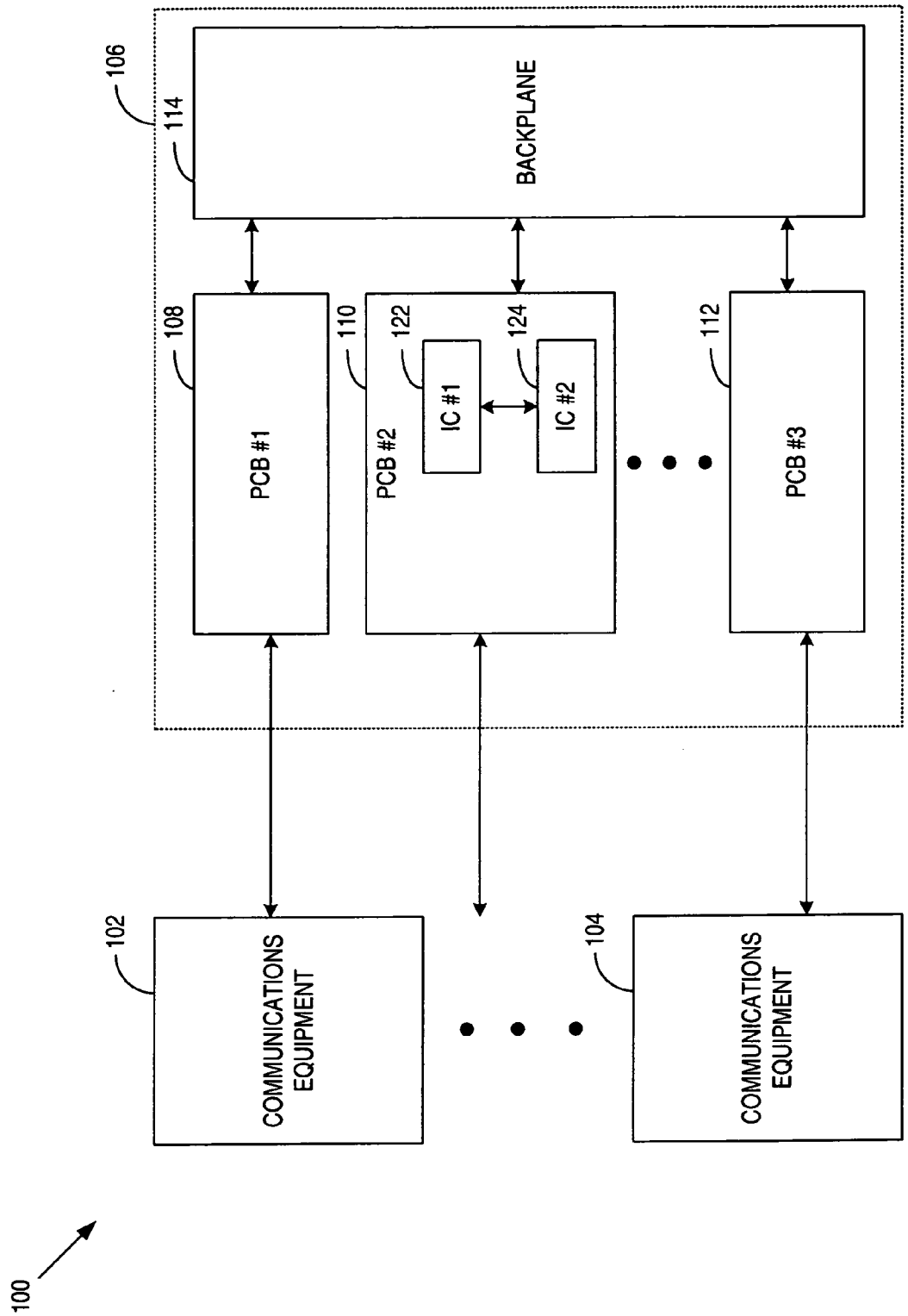
FIG. 1 illustrates an exemplary communication system.

Application of an embodiment of the present invention is virtually unlimited and may be utilized with any communication system that may require voltage translation. Communication system 100 of FIG. 1, for example, is illustrated in which an embodiment of the present invention may be utilized. Communication equipment blocks 102–106 may represent communicating entities, in which communication takes place at various levels and distances using various technologies.

Communication equipment blocks 102–104, for example, may communicate with communication block 106 via a Local Area Network (LAN) or Storage Network (SN) using technologies such as 1 Gigabit Ethernet, or 10 Gigabit Ethernet, as specified by IEEE 802.3. Communication system 100 may designate a data center, SN, or System Area Network (SAN), in which the Infiniband serial I/O interconnect architecture, or Fiber Channel, is utilized. Conversely, communication system 100 may represent a Synchronous Optical NETwork (SONET) or Synchronous Digital Hierarchy (SDH) employed by many Internet Service Providers (ISPs) and other high bandwidth end users.

Still other communication technologies supported by communication system 100 may include Peripheral Component Interconnect (PCI), PCI-Express, RapidIO, and Serial Advanced Technology Attachment (ATA). Such communication standards may be implemented, for example, to support communications between Printed Circuit Boards (PCBs) 108–112, Integrated Circuits 122–124, and backplane 114. One of ordinary skill in the art may recognize that any number of communication standards may benefit from embodiments of the present invention as is discussed in more detail below.

Figure 2:
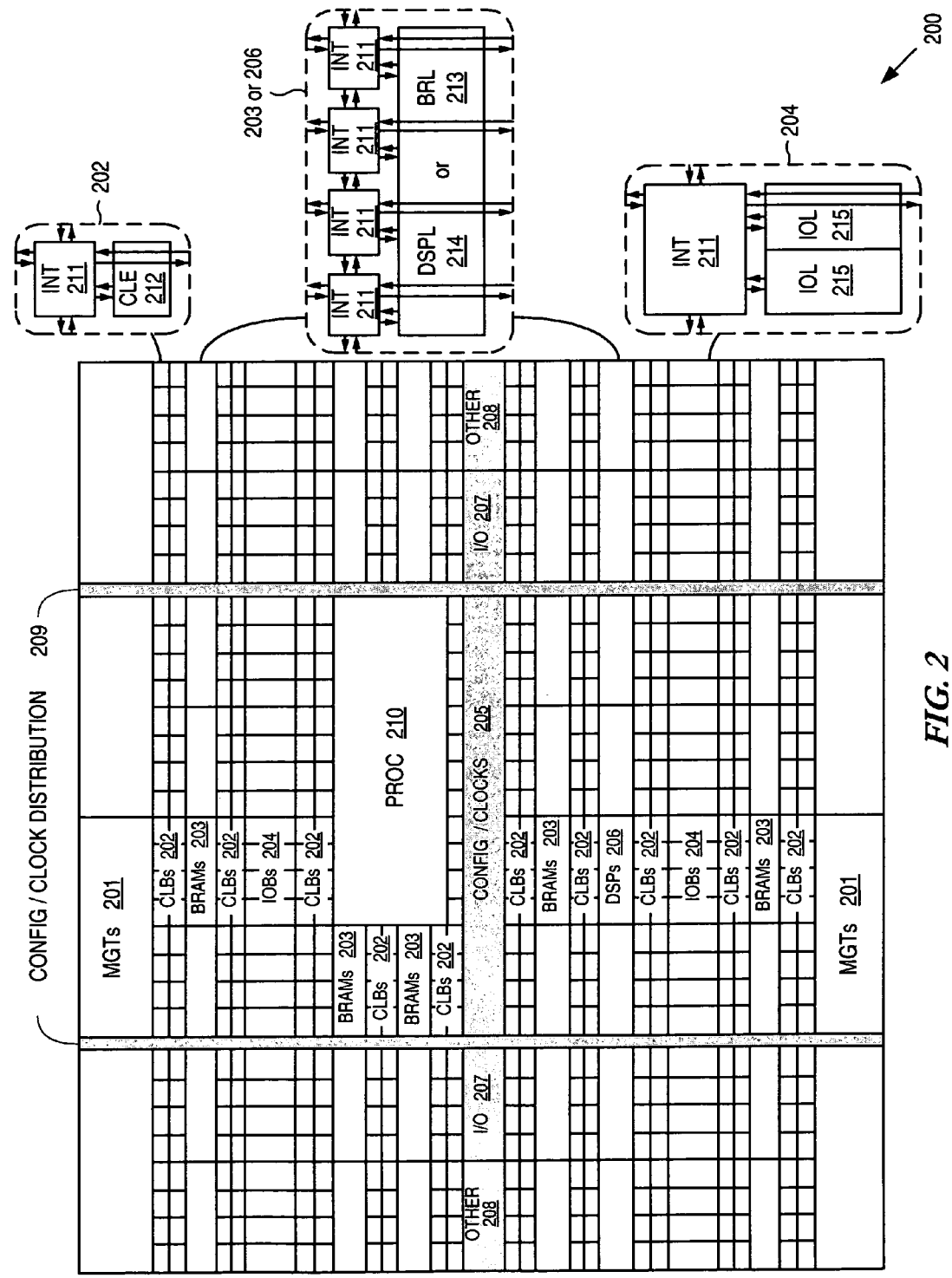
FIG. 2 illustrates an exemplary Field Programmable Gate Array (FPGA) architecture in which the principles of an embodiment of the present invention may be utilized.

Integrated circuits 122–124 may be represented by virtually any semiconductor device in use today. One such device is the Field Programmable Gate Array (FPGA), which facilitates a wide variety of applications due to its configurability. Advanced FPGAs can include several different types of programmable logic blocks in the array. For example, FIG. 2 illustrates an FPGA architecture 200 that includes a large number of different programmable tiles including Multi-Gigabit Transceivers (MGTs) 201, CLBs 202, BRAMs 203, IOBs 204, configuration and clocking logic CONFIG/CLOCKS 205, DSPs 206, specialized I/O 207, including configuration ports and clock ports, and other programmable logic 208, such as digital clock managers, analog-to-digital converters, system monitoring logic, and so forth. Some FPGAs also include dedicated processor blocks PROC 210, in which specific CPU related functionality may be utilized that is separate from the FPGA fabric.

In some FPGAs, each programmable tile includes programmable interconnect element INT 211 having standardized connections to and from a corresponding interconnect element in each adjacent tile. Therefore, the programmable interconnect elements taken together implement the programmable interconnect structure for the illustrated FPGA. INT 211 also includes the connections to and from the programmable logic element within the same tile, as shown by the examples of blocks 202 and 204.

For example, a CLB 202 may include a Configurable Logic Element CLE 212 that may be programmed to implement user logic plus a single programmable interconnect element INT 211. A BRAM 203 can include a BRAM logic element (BRL 213) in addition to one or more programmable interconnect elements. Typically, the number of interconnect elements included in a tile depends on the height of the tile (as measured from right to left of FIG. 2). In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 may include, for example, two instances of an input/output logic element IOL 215 in addition to one instance of the programmable interconnect element INT 211.

Interconnection within FPGA 200 often involves the propagation of data throughout circuits within the FPGA that operate at varying operational voltage levels. In particular, I/O circuitry internal to the FPGA that is designed to communicate with devices external to the FPGA generally operate at higher potentials, since devices external to the FPGA are also operating at the higher potentials. As the data is received from the external devices and is propagated throughout the FPGA, however, traversal of circuits operating at lower potentials is almost certain. Thus, an embodiment of the present invention may be applied in those instances whereby data traverses one or more circuits that operate at different operational voltage levels. As such, data traversal from a higher potential circuit to a lower potential circuit is made possible. Alternately, data traversal from a lower potential circuit to a higher potential circuit is also made possible.

As will be clear to those of skill in the art, the actual I/O pads connected, for example, to the I/O logic element 215 are manufactured using metal layers above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 may span several columns of CLBs and BRAMs.

Note that FIG. 2 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 202, 203, and 204 are purely exemplary. For example, in an actual FPGA more than one adjacent column of CLBs is typically included wherever the CLBs appear, to facilitate the efficient implementation of user logic.

Figure 3:
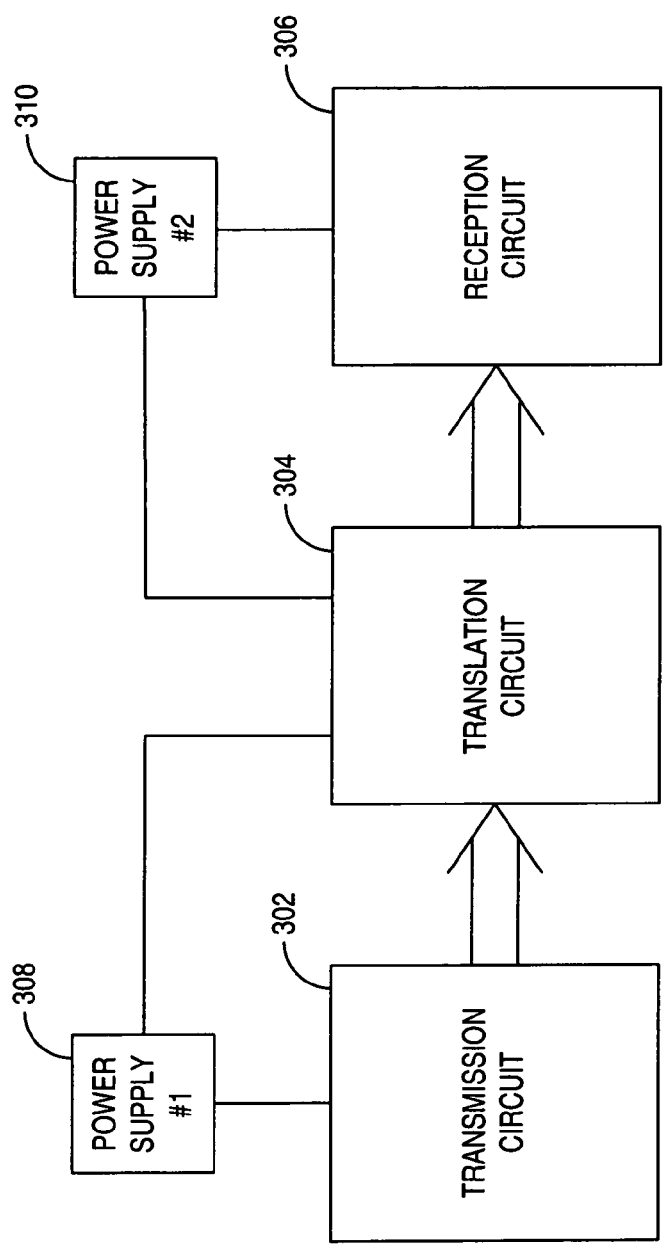
FIG. 3 illustrates an exemplary transmission subsystem in which an embodiment of the present invention may be utilized.

Turning to FIG. 3, a high level block diagram of a translation system in accordance with an embodiment of the present invention is exemplified. As discussed above in relation to FIG. 1, transmission circuit 302 may reside within the same IC, e.g., 122, as does translation circuit 304 and reception circuit 306. In other embodiments, transmission circuit 302, translation circuit 304, and reception circuit 306 may exist on the same PCB, e.g. 110, but may in fact reside on separate ICs. In other embodiments, transmission circuit 302, translation circuit 304, and reception circuit 306 may reside in separate communications equipment, e.g., 102, 104, and 106, respectively. It can be seen, therefore, that the relative proximity of transmission circuit 302, translation circuit 304, and reception circuit 306 is virtually irrelevant to the operation of some embodiments of the present invention.

Generally speaking, transmission circuit 302 derives its operational power from power supply #1 308, which provides a supply voltage magnitude that is different from the supply voltage magnitude of power supply #2 310. Power supply #2 310 provides operational power to reception circuit 306, while translation circuit 304 receives operational power from both power supplies 308 and 310.

In operation, transmission circuit 302 transmits data to translation circuit 304. The logic low magnitude of the transmitted data is substantially equal to a reference voltage magnitude, e.g., ground potential. The logic high magnitude of the transmitted data may vary widely, which is to say that the logic high magnitude may take on virtually any magnitude that is less than or equal to the voltage magnitude as provided by power supply #1 308. Translation circuit 304 is then responsive to receive the transmitted data and to convert the logic high magnitude of the transmitted data to a voltage magnitude that is compatible with power supply #2 310. That is to say, that the logic high magnitude of the converted data may take on virtually any magnitude that is less than or equal to the voltage magnitude as provided by power supply #2 310. Once converted, the data is then transmitted to reception circuit 306 having logic high magnitudes that are less than or equal to the voltage magnitude as provided by power supply #2 310 and logic low magnitudes substantially equal to a reference voltage magnitude, e.g., ground potential.

Figure 4:
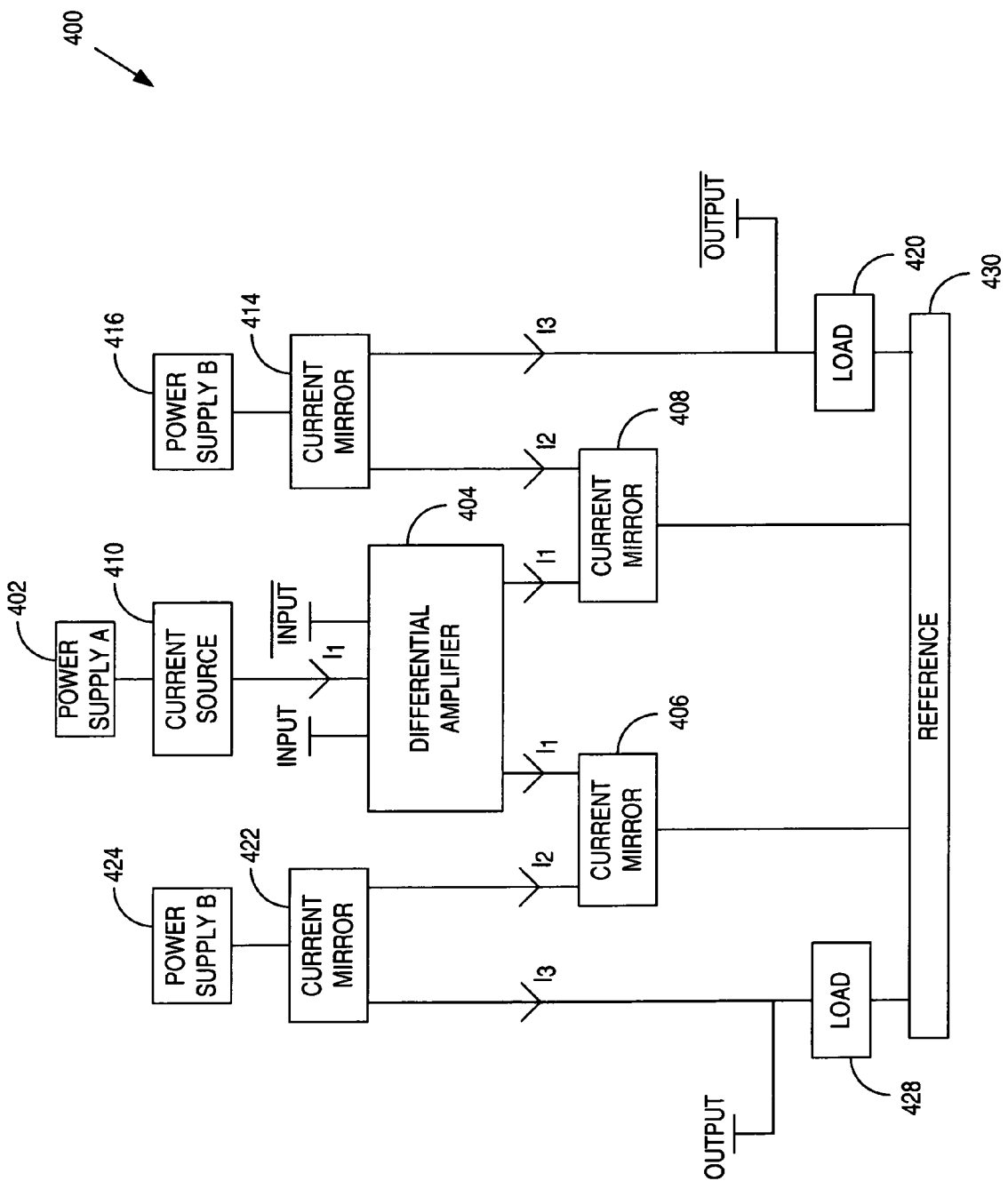
FIG. 4 illustrates an exemplary block diagram of a voltage translating driver in accordance with an embodiment of the present invention.

Turning to FIG. 4, exemplary translation circuit block diagram 400 is illustrated in accordance with an embodiment of the present invention. Differential amplifier block 404 is coupled to receive input signals, INPUT and $\overline{\text{INPUT}}$, having a voltage swing between a minimum voltage magnitude that is substantially equal to the voltage magnitude of reference 430 and a maximum voltage magnitude that is less than or equal to the voltage magnitude of power supply A 402.

Depending upon the logic values of input signals, INPUT and $\overline{\text{INPUT}}$, the tail current, $I_1$, provided by current source 410 is either at least partially conducted by current mirror 406 or at least partially conducted by current mirror 408. If signal INPUT is at a voltage magnitude less than signal $\overline{\text{INPUT}}$, for example, current mirror 406 at least partially conducts tail current $I_1$, which is referenced between power supply A 402 and reference 430.

The conduction of current $I_1$ by current mirror 406 causes conduction of mirrored current $I_2$ via current mirror 406, which in turn causes the conduction of mirrored current $I_3$ via current mirror 422. As discussed in more detail below, the current magnitudes of mirrored current $I_2$ and $I_3$ are proportionally related to the magnitude of tail current $I_1$. It should be noted that load 428 then conducts mirrored current $I_3$, which is completely referenced between power supply B 424 and reference 430 and thus provides an output voltage swing in response to signal INPUT that is referenced between power supply B 424 and reference 430.

If, on the other hand, signal $\overline{\text{INPUT}}$ is at a voltage magnitude less than signal INPUT, then current mirror 408 at least partially conducts tail current $I_1$, which is referenced between power supply A 402 and reference 430.

The conduction of current $I_1$ by current mirror 408 causes conduction of mirrored current $I_2$ via current mirror 408, which in turn causes the conduction of mirrored current $I_3$ via current mirror 414. As discussed in more detail below, the current magnitudes of mirrored current $I_2$ and $I_3$ are proportionally related to the magnitude of tail current $I_1$. It should be noted that load 420 then conducts mirrored current $I_3$, which is completely referenced between power supply B 416 and reference 430 and thus provides an output voltage swing in response to signal $\overline{\text{INPUT}}$ that is referenced between power supply B 416 and reference 430.

Figure 5:
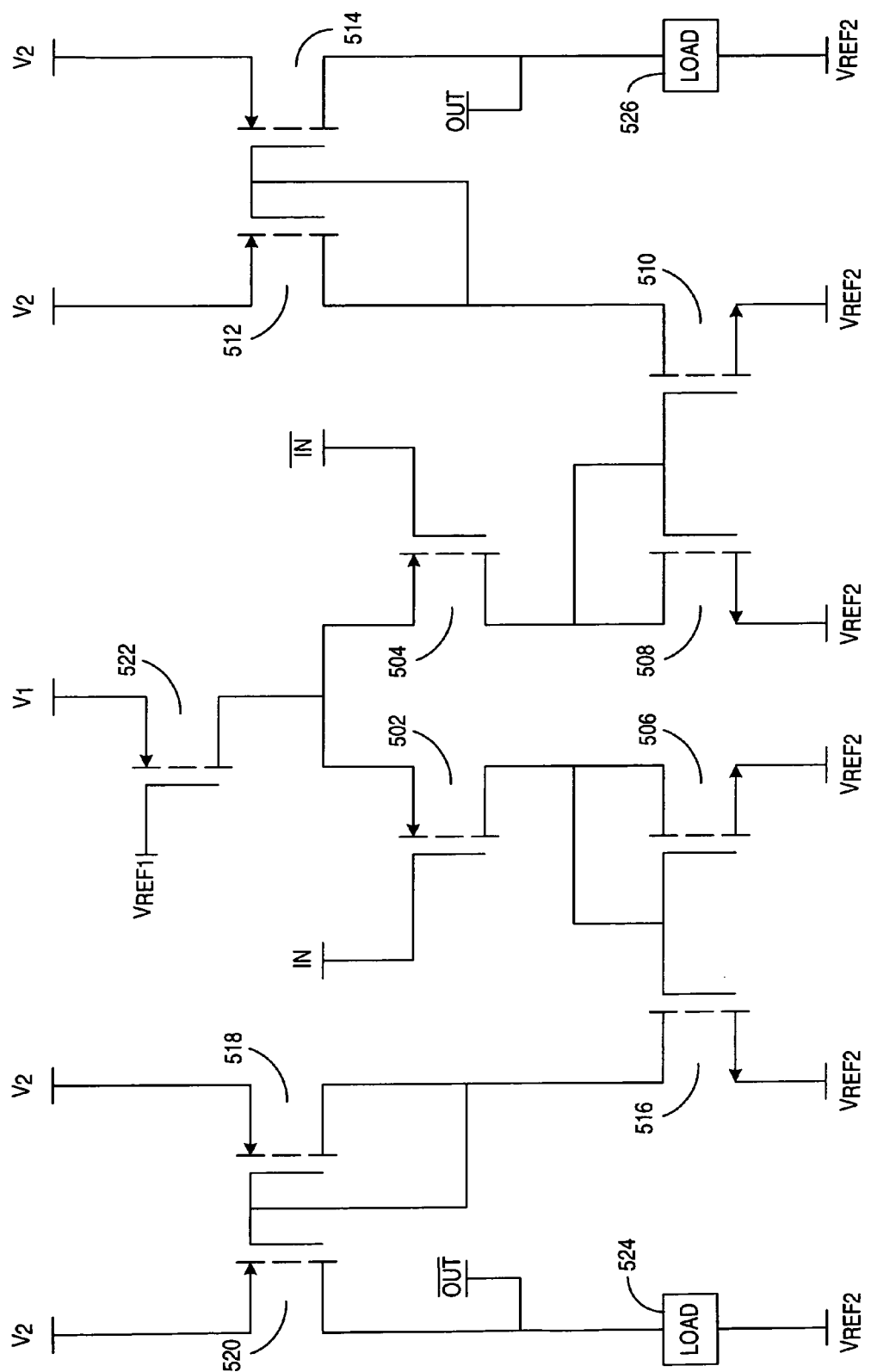
FIG. 5 illustrates an exemplary schematic diagram of a voltage translating driver in accordance with another embodiment of the present invention.

Turning to FIG. 5, an exemplary schematic diagram of translation circuit 400 of FIG. 4 is illustrated. The configuration of current source 410 is exemplified by transistor 522, whereby the source terminal of transistor 522 is connected to the first supply voltage, $V_1$, and the control terminal of transistor 522 is connected to a reference voltage supply, e.g., $V_{REF1}$. While a single transistor is illustrated for current source 510, multiple transistors in cascode configuration may instead be used to allow current source 410 to provide, among other features, greater power supply isolation from power supply $V_1$.

The configuration of differential amplifier 404 is exemplified by the illustrated interconnection of transistors 502–504. In particular, the source terminals of transistors 502 and 504 are commonly connected to the drain terminal of transistor 522. The control terminals of transistors 502 and 504 are coupled to receive differential input signals, IN and $\overline{\text{IN}}$, respectively.

The configuration of current mirror 406 is exemplified by the illustrated interconnection of transistors 506 and 516. In particular, the control terminals of transistors 506 and 516 are commonly connected to the drain terminal of transistor 502. The source terminals of transistors 506 and 516 are connected to reference supply voltage, $V_{REF2}$, which in one embodiment is substantially equal to ground potential.

The configuration of current mirror 422 is similarly exemplified by the illustrated interconnection of transistors 518 and 520. In particular, the control terminals of transistors 518 and 520 are commonly connected to the drain terminal of transistor 516. The source terminals of transistors 518 and 520 are connected to the second supply voltage, $V_2$. It should be noted, that while current sources 516 and 520 are illustrated as single transistors, a cascode arrangement of transistors may also be used in order to increase isolation from $V_{REF2}$ and $V_2$, respectively.

The configuration of current mirror 408 is similarly exemplified by the illustrated interconnection of transistors 508 and 510. In particular, the control terminals of transistors 508 and 510 are commonly connected to the drain terminal of transistor 504. The source terminals of transistors 508 and 510 are connected to reference supply voltage, $V_{REF2}$, which in one embodiment is substantially equal to ground potential.

The configuration of current mirror 414 is similarly exemplified by the illustrated interconnection of transistors 512 and 514. In particular, the control terminals of transistors 512 and 514 are commonly connected to the drain terminal of transistor 510. The source terminals of transistors 512 and 514 are connected to the second supply voltage, $V_2$. It should be noted, that while current sources 510 and 514 are illustrated as single transistors, a cascode arrangement of transistors may also be used in order to increase isolation from $V_{REF2}$ and $V_2$, respectively.

In operation, the differential input signal, IN and $\overline{IN}$, causes a differential current to flow into transistors 506 and 508, respectively. In particular, if the voltage magnitude of signal, IN, is less than the voltage magnitude of signal, $\overline{IN}$, then the tail current generated by transistor 522 is at least partially conducted by transistors 502 and 506. The tail current conducted by diode connected transistor 506 (i.e., operating as a voltage reference) then biases the gate to source potential, $V_{GS}$, of transistor 516 to be equal to the $V_{GS}$ of transistor 506.

Accordingly, transistor 516 (operating as a current source) conducts an amount of current that is in geometric proportion to the amount of current conducted by transistor 506. In one embodiment, the geometric dimensions of transistors 506 and 516 are identical, such that the amount of current conducted by transistors 506 and 516 is identical. In another embodiment, however, the geometric dimensions may not be identical, such that the current magnitude conducted by transistor 516 is different than the current magnitude conducted by transistor 506.

Similarly, the current conducted by transistor 516 causes the $V_{GS}$ Of transistor 520 to be equal to the $V_{GS}$ of diode connected transistor 518 (i.e., transistor 518 is operating as a voltage reference). Accordingly, transistor 520 (operating as a current source) conducts an amount of current that is in geometric proportion to the amount of current conducted by transistor 518. In one embodiment, the geometric dimensions of transistors 520 and 518 are identical, such that the amount of current conducted by transistors 520 and 518 is identical. In another embodiment, however, the geometric dimensions may not be identical, such that the current magnitude conducted by transistor 520 is different than the current magnitude conducted by transistor 518.

It can be seen, therefore, that the current conducted by load 524 is related in magnitude to the tail current of transistor 522 by the ratio proportion of the relative geometries of transistor pairs 506/516 and 518/520. In addition, the current conducted by load 524 generates an output signal, $\overline{OUT}$, that is entirely referenced between the second power supply, $V_2$, and the reference voltage, $V_{REF2}$.

If, on the other hand, the voltage magnitude of signal, $\overline{IN}$, is less than the voltage magnitude of signal, IN, then the tail current generated by transistor 522 is at least partially conducted by transistors 504 and 508. The tail current conducted by diode connected transistor 508 (i.e., operating as a voltage reference) then biases the $V_{GS}$ of transistor 510 to be equal to the $V_{GS}$ of transistor 508.

Accordingly, transistor 510 (operating as a current source) conducts an amount of current that is in geometric proportion to the amount of current conducted by transistor 508. In one embodiment, the geometric dimensions of transistors 508 and 510 are identical, such that the amount of current conducted by transistors 508 and 510 is identical. In another embodiment, however, the geometric dimensions may not be identical, such that the current magnitude conducted by transistor 510 is different than the current magnitude conducted by transistor 508.

Similarly, the current conducted by transistor 510 causes the $V_{GS}$ of transistor 514 to be equal to the $V_{GS}$ of diode connected transistor 512 (i.e., transistor 512 is operating as a voltage reference). Accordingly, transistor 514 conducts an amount of current that is in geometric proportion to the amount of current conducted by transistor 512. In one embodiment, the geometric dimensions of transistors 514 and 512 are identical, such that the amount of current conducted by transistors 514 and 512 is identical. In another embodiment, however, the geometric dimensions may not be identical, such that the current magnitude conducted by transistor 514 is different than the current magnitude conducted by transistor 512.

It can be seen, therefore, that the current conducted by load 526 is related in magnitude to the tail current of transistor 522 by the ratio proportion of the relative geometries of transistor pairs 508/510 and 512/514. In addition, the current conducted by load 526 generates an output signal, OUT, that is entirely referenced between the second power supply, $V_2$, and the reference voltage, $V_{REF2}$.

It should be noted, that while FIG. 5 is exemplified as facilitating translation of logic values, IN and $\overline{IN}$, operating between $V_{REF2}$ and $V_1$ to logic values, OUT and $\overline{OUT}$, operating between $V_{REF2}$ and $V_2$, further translations may be possible. For example, if a second translation is desired, then signals, OUT and $\overline{OUT}$, may be propagated to another translation stage that is identical to the translation stage of FIG. 5 to effect the translation.

It should further be noted that while one embodiment of the present invention is exemplified as being implemented using FET technology, other active components may be utilized. For example, bi-polar transistors may be utilized, whereby NPN bipolar transistors replace the N-type FETs of FIG. 5 and PNP bipolar transistors replace the P-type FETs of FIG. 5.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A translation circuit, comprising:
   an amplifier coupled to receive an input signal having an amplitude less than or equal to a first power supply voltage and adapted to provide a first current signal in response to the input signal;
   a first current mirror coupled to receive the first current signal and adapted to conduct a second current signal in ratio proportion to the first current signal in response to the first current signal;
   a second current mirror coupled to receive the second current signal and adapted to conduct a third current signal in ratio proportion to the second current signal in response to second current signal; and
   a load coupled to receive the third current signal and adapted to generate an output signal having an amplitude less than or equal to a second power supply voltage in response to the third current signal, wherein the voltages of the first and second power supplies are different.

2. The translation circuit of claim 1, wherein the amplifier includes a first transistor having a control terminal coupled to receive the input signal, a first conductor coupled to a first power supply, and a second conductor coupled to provide the first current signal.

3. The translation circuit of claim 2, wherein the first transistor includes a Field Effect Transistor (FET).

4. The translation circuit of claim 2, wherein the first current mirror includes,
a second transistor having a control terminal and a first conductor commonly coupled to the second conductor of the first transistor and a second conductor coupled to a reference supply; and
a third transistor having a control terminal coupled to the control terminal of the second transistor and a first conductor coupled to provide the second current signal and a second conductor coupled to the reference supply.

5. The translation circuit of claim 4, wherein the second transistor includes a FET.

6. The translation circuit of claim 4, wherein the third transistor includes a FET.

7. The translation circuit of claim 4, wherein the second current mirror includes,
a fourth transistor having a control terminal and a first conductor commonly coupled to the first conductor of the third transistor and a second conductor coupled to a second power supply; and
a fifth transistor having a control terminal coupled to the control terminal of the fourth transistor and a first conductor coupled to provide the third current signal and a second conductor coupled to the second power supply.

8. The translation circuit of claim 7, wherein the fourth transistor includes a FET.

9. The translation circuit of claim 7, wherein the fifth transistor includes a FET.

10. An integrated circuit, comprising:
a first circuit component adapted to generate a first data signal having a first amplitude; and
a translation circuit coupled to the first circuit component, the translation circuit including,
an amplifier coupled to a first power supply, the first power supply having a voltage greater than or equal to the first amplitude, and coupled to receive the first data signal and adapted to generate a first current signal in response to the first data signal; and
a current mirror network coupled to a second power supply, the second power supply having a voltage greater than or equal to a second amplitude, and coupled to receive the first current signal and adapted to generate a second current signal in response to the first current signal, wherein the second current signal generates a second data signal having the second amplitude.

11. The integrated circuit of claim 10, wherein the current mirror network comprises a first current mirror including,
a first voltage reference coupled to receive the first current signal and adapted to provide a first voltage signal in response to the first current signal; and
a first current source coupled to receive the first voltage signal and adapted to generate an intermediate current signal in response to the first voltage signal.

12. The integrated circuit of claim 11, wherein the first voltage reference comprises a first transistor having a control terminal and a first conduction terminal commonly coupled at a first node to receive the first current signal.

13. The integrated circuit of claim 12, wherein the first current source comprises a second transistor having a control terminal coupled to the first node and a first conduction terminal coupled to provide the intermediate current signal.

14. The integrated circuit of claim 11, wherein the current mirror network comprises a second current mirror including,
a second voltage reference coupled to receive the intermediate current signal and adapted to provide a second voltage signal in response to the intermediate current signal; and
a second current source coupled to receive the second voltage signal and adapted to generate the second current signal in response to the second voltage signal.

15. The integrated circuit of claim 14, wherein the second voltage reference comprises a first transistor having a control terminal and a first conduction terminal commonly coupled at a second node to receive the intermediate current signal.

16. The integrated circuit of claim 15, wherein the second current source comprises a second transistor having a control terminal coupled to the second node and a first conduction terminal coupled to provide the second current signal.

17. A method of translating an input signal at a first magnitude to an output signal at a second magnitude, the method comprising:
conducting a first current from a first power supply in response to receiving the input signal at the first magnitude;
conducting a second current in ratio proportion to the first current, the second current being conducted from a second power supply; and
conducting a third current in ratio proportion to the second current, the third current being conducted from the second power supply, wherein the third current generates the output signal at the second magnitude.

18. The method of claim 17, wherein conducting the first current comprises establishing a conductivity state of an input transistor in response to the input signal.

19. The method of claim 18, wherein conducting the second current comprises:
establishing a first voltage reference with the first current; and
biasing a first current source with the first voltage reference.

20. The method of claim 19, wherein conducting the third current comprises:
establishing a second voltage reference with the second current; and
biasing a second current source with the second voltage reference.

* * * * *